(12) United States Patent
Larson et al.

(10) Patent No.: US 7,371,332 B2
(45) Date of Patent: May 13, 2008

(54) UNIFORM ETCH SYSTEM

(75) Inventors: Dean J. Larson, Pleasanton, CA (US); Babak Kadkhodayan, Hayward, CA (US); Di Wu, Newark, CA (US); Kenji Takeshita, Fremont, CA (US); Bi-Ming Yen, Fremont, CA (US); Xingcai Su, Fremont, CA (US); William M. Denty, Jr., San Jose, CA (US); Peter Loewenhardt, Pleasanton, CA (US)

(73) Assignee: LAM Research Corporation, Fremont, CA (US)

( * ) Notice: Subject to any disclaimer, the term of this patent is extended or adjusted under 35 U.S.C. 154(b) by 255 days.

(21) Appl. No.: 10/642,083

(22) Filed: Aug. 14, 2003

(65) Prior Publication Data

US 2004/0112539 A1 Jun. 17, 2004

Related U.S. Application Data

(63) Continuation-in-part of application No. 10/318,612, filed on Dec. 13, 2002, now Pat. No. 7,169,231.

(51) Int. Cl.
 *H01L 21/306* (2006.01)
(52) U.S. Cl. ............... 216/58; 216/67; 156/345.29; 156/345.33
(58) Field of Classification Search ............... 216/58
 See application file for complete search history.

(56) References Cited

U.S. PATENT DOCUMENTS

| 4,275,752 A | 6/1981 | Collier et al. |
|---|---|---|
| 4,369,031 A | 1/1983 | Goldman et al. |
| 4,812,201 A | 3/1989 | Sakai et al. |
| 4,835,114 A | 5/1989 | Satou et al. |
| 4,980,204 A | 12/1990 | Fujii et al. ............... 117/98 |
| 5,013,398 A | 5/1991 | Long et al. ............... 156/643 |
| 5,077,875 A | 1/1992 | Hoke et al. |
| 5,134,965 A | 8/1992 | Tokuda et al. ............... 118/723 |
| 5,200,388 A | 4/1993 | Abe et al. |
| 5,288,325 A | 2/1994 | Gomi |
| 5,310,426 A | 5/1994 | Mori |

(Continued)

FOREIGN PATENT DOCUMENTS

EP  0 291 181 A2  11/1988

(Continued)

OTHER PUBLICATIONS

International Search Report, date of mailing Sep. 1, 2004.

(Continued)

*Primary Examiner*—Allan Olsen
(74) *Attorney, Agent, or Firm*—Beyer Law Group LLP

(57) ABSTRACT

Etching a layer over a substrate is provided. The substrate is placed in a plasma processing chamber. A first gas is provided to an inner zone within the plasma processing chamber. A second gas is provided to the outer zone within the plasma processing chamber, where the outer zone surrounds the inner zone and the first gas is different than the second gas. Plasmas are simultaneously generated from the first gas and second gas. The layer is etched, where the layer is etched by the plasmas from the first gas and second gas.

11 Claims, 13 Drawing Sheets

U.S. PATENT DOCUMENTS

| | | | |
|---|---|---|---|
| 5,313,982 A | 5/1994 | Ohmi et al. | |
| 5,356,515 A * | 10/1994 | Tahara et al. | 438/715 |
| 5,415,728 A | 5/1995 | Hasegawa et al. | 156/643.1 |
| 5,431,738 A | 7/1995 | Murakami et al. | 118/720 |
| 5,453,124 A | 9/1995 | Moslehi et al. | |
| 5,455,070 A * | 10/1995 | Anderson et al. | 427/248.1 |
| 5,460,654 A | 10/1995 | Kikkawa et al. | |
| 5,496,408 A | 3/1996 | Motoda et al. | 118/715 |
| 5,522,934 A | 6/1996 | Suzuki et al. | 118/723 |
| 5,532,190 A | 7/1996 | Goodyear et al. | 438/710 |
| 5,589,110 A | 12/1996 | Motoda et al. | |
| 5,614,055 A | 3/1997 | Fairbairn et al. | 156/345 |
| 5,620,524 A | 4/1997 | Fan et al. | |
| 5,651,825 A * | 7/1997 | Nakahigashi et al. | 118/723 ME |
| 5,702,530 A | 12/1997 | Shan et al. | 118/723 MP |
| 5,736,457 A | 4/1998 | Zhao | 438/624 |
| 5,744,049 A * | 4/1998 | Hills et al. | 216/67 |
| 5,772,771 A | 6/1998 | Li et al. | 118/723 I |
| 5,853,484 A | 12/1998 | Jeong | 118/715 |
| 5,865,205 A | 2/1999 | Wilmer | |
| 5,916,369 A | 6/1999 | Anderson et al. | 118/715 |
| 5,950,639 A | 9/1999 | Noah et al. | |
| 5,993,555 A | 11/1999 | Hamilton et al. | 118/715 |
| 6,001,172 A | 12/1999 | Bhandari et al. | 117/84 |
| 6,009,830 A | 1/2000 | Li et al. | 118/723 R |
| 6,013,155 A | 1/2000 | McMillin et al. | 156/345 |
| 6,015,595 A | 1/2000 | Felts | 427/446 |
| 6,019,060 A | 2/2000 | Lenz | 118/723 R |
| 6,039,074 A | 3/2000 | Raaijmakers et al. | |
| 6,042,687 A | 3/2000 | Singh et al. | 156/345 |
| 6,058,958 A | 5/2000 | Benkowski et al. | |
| 6,090,210 A * | 7/2000 | Ballance et al. | 118/725 |
| 6,119,710 A | 9/2000 | Brown | |
| 6,125,788 A | 10/2000 | Hills et al. | |
| 6,132,515 A | 10/2000 | Gauthier | |
| 6,155,289 A | 12/2000 | Carlsen et al. | |
| 6,192,919 B1 | 2/2001 | Jackson et al. | |
| 6,224,681 B1 | 5/2001 | Sivaramakrishnan et al. | |
| 6,251,792 B1 * | 6/2001 | Collins et al. | 438/710 |
| 6,253,783 B1 | 7/2001 | Carlsen et al. | |
| 6,296,711 B1 | 10/2001 | Loan et al. | |
| 6,302,139 B1 | 10/2001 | Dietz | |
| 6,315,858 B1 | 11/2001 | Shinozuka et al. | |
| 6,333,272 B1 | 12/2001 | McMillin et al. | 438/710 |
| 6,418,954 B1 | 7/2002 | Taylor | |
| 6,457,494 B1 | 10/2002 | Gregg et al. | |
| 6,508,913 B2 | 1/2003 | McMillin et al. | 156/345.29 |
| 6,589,350 B1 | 7/2003 | Swartz | 118/710 |
| 6,632,322 B1 * | 10/2003 | Gottscho et al. | 156/345.33 |
| 2001/0047760 A1 * | 12/2001 | Moslehi | 118/723 I |
| 2002/0014207 A1 | 2/2002 | Sivaramakrishnan et al. | |
| 2002/0018965 A1 | 2/2002 | Vahedi et al. | |
| 2002/0100416 A1 | 8/2002 | Sun et al. | |
| 2002/0108570 A1 | 8/2002 | Lindfors | |
| 2002/0108933 A1 * | 8/2002 | Hoffman et al. | 219/121.43 |
| 2002/0144657 A1 | 10/2002 | Chiang et al. | |
| 2002/0144706 A1 | 10/2002 | Davis et al. | 134/1.1 |
| 2002/0160125 A1 * | 10/2002 | Johnson et al. | 427/569 |
| 2002/0170598 A1 | 11/2002 | Girard et al. | |
| 2002/0173160 A1 | 11/2002 | Keil et al. | |
| 2002/0192369 A1 | 12/2002 | Morimoto et al. | |
| 2003/0003696 A1 * | 1/2003 | Gelatos et al. | 438/485 |
| 2003/0019580 A1 * | 1/2003 | Strang | 156/345.33 |
| 2003/0070620 A1 * | 4/2003 | Cooperberg et al. | 118/723 AN |
| 2003/0094903 A1 * | 5/2003 | Tao et al. | 315/111.91 |
| 2003/0226641 A1 * | 12/2003 | Collins et al. | 156/345.49 |
| 2004/0112540 A1 | 6/2004 | Larson et al. | |
| 2004/0129211 A1 * | 7/2004 | Blonigan et al. | 118/715 |

FOREIGN PATENT DOCUMENTS

| | | |
|---|---|---|
| EP | 1077476 | 2/2001 |
| EP | 1 158 565 A2 | 11/2001 |
| EP | 1 300 877 A1 | 4/2003 |
| JP | 403-281780 | 12/1991 |
| JP | 11/016888 A | 1/1999 |
| JP | 2002/280357 | 9/2002 |
| WO | 01/29879 A2 | 4/2001 |
| WO | 02/080251 A1 | 10/2002 |
| WO | WO 02/095519 A1 | 11/2002 |

OTHER PUBLICATIONS

C. Janowiak et al., "Etching of organic low dielectric constant material SiLK™ on the Lam Research Corporation 4520XLE™", J. Vac. Sci. Technol. A 18(4), Jul./Aug. 2000, pp. 1859-1863.

International Search Report, dated Dec. 1, 2005.

U.S. Office Action mailed Nov. 14, 2005 from U.S. Appl. No. 10/318,612.

U.S. Office Action mailed Mar. 9, 2006 from U.S. Appl. No. 10/685,739.

U.S. Office Action mailed Apr. 7, 2006 from U.S. Appl. No. 10/318,612.

Office Action Dated Aug. 3, 2004 from U.S. Appl. No. 10/318,612.

Office Action Dated Jan. 13, 2005 from U.S. Appl. No. 10/318,612.

Office Action Dated Jun. 7, 2005 from U.S. Appl. No. 10/318,612.

Notice of Allowance Dated Oct. 5, 2006 from U.S. Appl. No. 10/318,612.

Office Action Dated Aug. 15, 2006 from U.S. Appl. No. 10/685,739.

Office Action Dated Jun. 1, 2007 from U.S. Appl. No. 10/685,739.

Office Action Dated Jul. 19, 2007 from U.S. Appl. No. 10/685,739.

Office Action Dated Jul. 24, 2006 from U.S. Appl. No. 10/877,222.

Office Action Dated Apr. 25, 2007 from U.S. Appl. No. 10/877,222.

Office Action Dated Oct. 11, 2007 from U.S. Appl. No. 10/877,222.

U.S. Office Action mailed Aug. 3, 2004 from U.S. Appl. No. 10/318,612.

U.S. Office Action mailed Jan. 13, 2005 from U.S. Appl. No. 10/318,612.

U.S. Office Action mailed Apr. 27, 2005 from U.S. Appl. No. 10/685,739.

U.S. Office Action mailed Jun. 7, 2005 from U.S. Appl. No. 10/318,612.

U.S. Office Action mailed Oct. 14, 2005 from U.S. Appl. No. 10/685,739.

Mirriam-Webster's Collegiate Dictionary—10th Ed. p. 820 ("orifice"), 1997.

European Search Report from EP Application No. 03790343.2 mailed Dec. 5, 2007.

* cited by examiner

 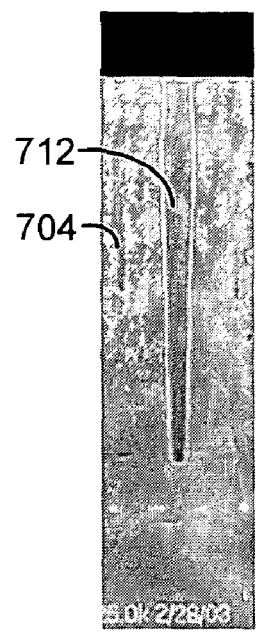 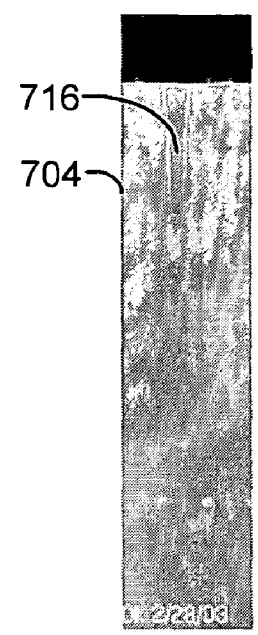
FIG. 7A FIG. 7B FIG. 7C
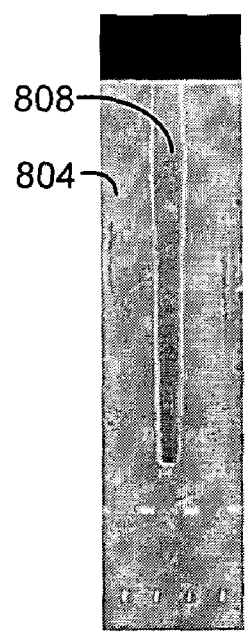 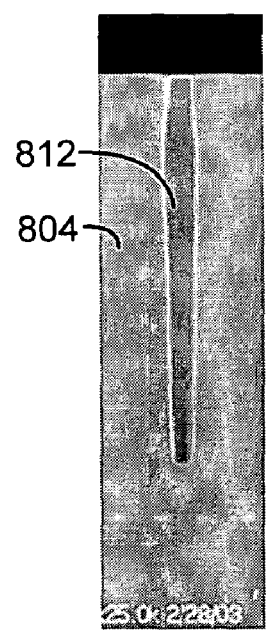 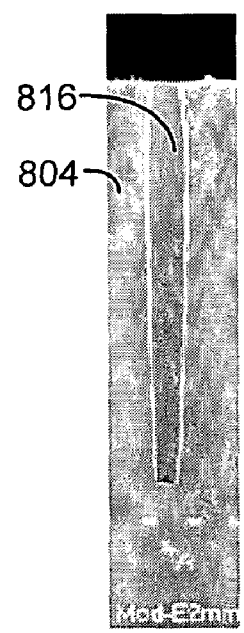
FIG. 8A FIG. 8B FIG. 8C

UNIFORM ETCH SYSTEM

RELATED APPLICATIONS

This application is a continuation-in-part of U.S. Patent 7,169,231, filed as Application No. 10/318,612 entitled "Gas Distribution System with Tuning Gas," by Larson et al. filed Dec. 13, 2002, which is hereby incorporated by reference.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. Such semiconductor processes are typically carried out in vacuum chambers wherein process gas is used to treat a substrate such as a semiconductor wafer, flat panel display substrate, etc. The process gas can be supplied to the interior of the vacuum chamber by a gas distribution system such as a showerhead, a gas distribution ring, gas injectors, etc. Reactors having plural gas distribution systems are disclosed in U.S. Pat. Nos. 5,134,965; 5,415,728; 5,522,934; 5,614,055; 5,772,771; 6,013,155; and 6,042,687.

In the case of etching, plasma etching is conventionally used to etch metal, dielectric and semiconducting materials. A plasma etch reactor typically includes a pedestal supporting the silicon wafer on a bottom electrode, an energy source which energizes process gas into a plasma state, and a process gas source supplying process gas to the chamber.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

It is desirable to evenly distribute the plasma over the surface of the wafer in order to obtain uniform etching rates over the entire surface of the wafer. Some gas distribution chamber designs include multiple supply lines and multiple mass flow controllers (MFCs) feeding separate regions in the chamber. However, these gas distribution designs require numerous components, complexity in design and high cost.

It therefore would be desirable to reduce the complexity and cost to manufacture such gas distribution arrangements.

U.S. Pat. No. 6,333,272, which is incorporated by reference, describes a dual feed gas distribution system for semiconductor processing, wherein a processing chamber 10 is supplied processing gas through gas supply line 12 (which can provide process gas to a showerhead or other gas supply arrangement arranged in the upper portion of the chamber) and a gas supply line 14 (which supplies processing gas to a lower portion of the chamber such as, for example, to a gas distribution ring surrounding the substrate holder or through gas outlets arranged in the substrate support), as shown in FIG. 1. However, an alternative dual gas feed arrangement can supply gas to the top center and top perimeter of the chamber. Processing gas is supplied to the gas lines 12, 14 from gas supplies 16, 18, 20, the process gasses from supplies 16, 18, 20 being supplied to mass flow controllers 22, 24, 26, respectively. The mass flow controllers 22, 24, 26 supply the process gasses to a mixing manifold 28 after which the mixed gas is directed to the flow lines 12, 14. Flow line 12 may include a combination of a flow meter 42, a feedback controlled throttling valve 44, and flow line 14 may include a flow measurement device 34 and a feedback control valve 36, so that the process feed gas is split using two throttling valves and two flow meters. A control system 40 monitors the flow measurement devices 34 and 42 and is effective to control the mass flow controllers 22, 24, 26 as well as the feedback control valves 36 and 44. This feedback control system allows adjustment of the proportion of mixed gas delivered to two zones of the processing chamber. The open aperture of one or both of the throttle valves can be adjusted based upon a comparison of the user selected flow-splitting and flow meter readings. Conveniently, the combination of the flow meter and throttling valve could be implemented using a conventional mass flow controller, where the control system sends separate flow setpoint controls to each leg to achieve the user's selected flow splitting.

In operation, the user would select set points for the flows of each feed gas within the gas box, and would select the fraction of mixed flow to be delivered to each region of the processing chamber. For example, the user might select a flow of 250 sccm Ar/30 sccm $C_4F_8$/15 sccm $C_4F_6$/22 sccm $O_2$ with 75% delivered through line 12 and 25% through line 14. The fraction of mixed flow in the respective delivery lines is controlled by repeated adjustment of the feedback control valve 36 in line 14 based upon the actual flow measured in line 14 with respect to its target flow, while the feedback control valve 44 in line 12 is full open. By comparing the total flow, which in this case could be measured by summing all of the flow readouts of the mass flow controllers 22, 24, 26 in the gas box, with the flow measured by the meter 42 in the chamber delivery line 12, the controller can adjust the degree of throttling in the valve 36 in line 14 to achieve the desired flow distribution. Alternatively, an optional total flow meter could be installed just downstream of the mixing manifold 28 to measure the total flow of mixed gas, rather than determining the total flow by summing the readouts of the MFCs 22, 24, 26 in the gas box.

SUMMARY OF THE INVENTION

To achieve the foregoing and in accordance with the purpose of the present invention a method, for etching a layer over a substrate is provided. The substrate is placed in a plasma processing chamber. A first gas is provided to an inner zone within the plasma processing chamber. A second gas is provided to the outer zone within the plasma processing chamber, where the outer zone surrounds the inner zone and the first gas is different than the second gas. Plasmas are simultaneously generated from the first gas and second gas. The layer is etched, where the layer is etched by the plasmas from the first gas and second gas.

In another manifestation of the invention an apparatus for etching features in a layer over a wafer is provided. An etching chamber is provided. A wafer support is connected to the etching chamber for mounting the wafer within the etching chamber. A gas distribution system is connected to the etching chamber. The gas distribution system comprises an inner zone gas distribution system and an outer zone gas distribution system, where the outer zone gas distribution system surrounds the inner zone gas distribution system. A gas source is in fluid connection with the inner zone gas distribution system and the outer zone gas distribution system, where the gas source provides a first gas to the inner zone gas distribution system and a second gas to the outer zone gas distribution system, where the first gas is different than the second gas. A power source is connected to the etch chamber for providing power to the etch chamber sufficient to create plasmas from the first gas and the second gas and cause an etching of the layer to be etched by plasmas from the first gas and the second gas.

In another manifestation of the invention a method for etching a layer over a substrate is provided. The substrate is placed in a plasma processing chamber, with a gas distribution system with an inner zone placed opposite an inner portion of the substrate and an outer zone surrounding the inner zone. A first gas is provided to the inner zone of the gas distribution system, where the first gas comprises at least a first component gas and a second component gas. A second gas is provided to the outer zone of the gas distribution system, where the second gas comprises at least the first component gas and the second component gas, wherein the first component gas has a lower molecular weight than the second gas component, where a ratio of the first component gas to the second component gas for the second gas is greater than a ratio of the first component gas to the second component gas for the first gas. Plasmas are simultaneously generated from the first gas and second gas. The layer is etched, where the layer is etched by the plasmas from the first gas and second gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 7A-C are photographs of cross-sections of a wafer at various distances from the center of the wafer, after the wafer has been etched using a control process.

FIGS. 8A-C are photographs of cross-sections of a wafer at various distances from the center of the wafer, after the wafer has been etched using an inventive process.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
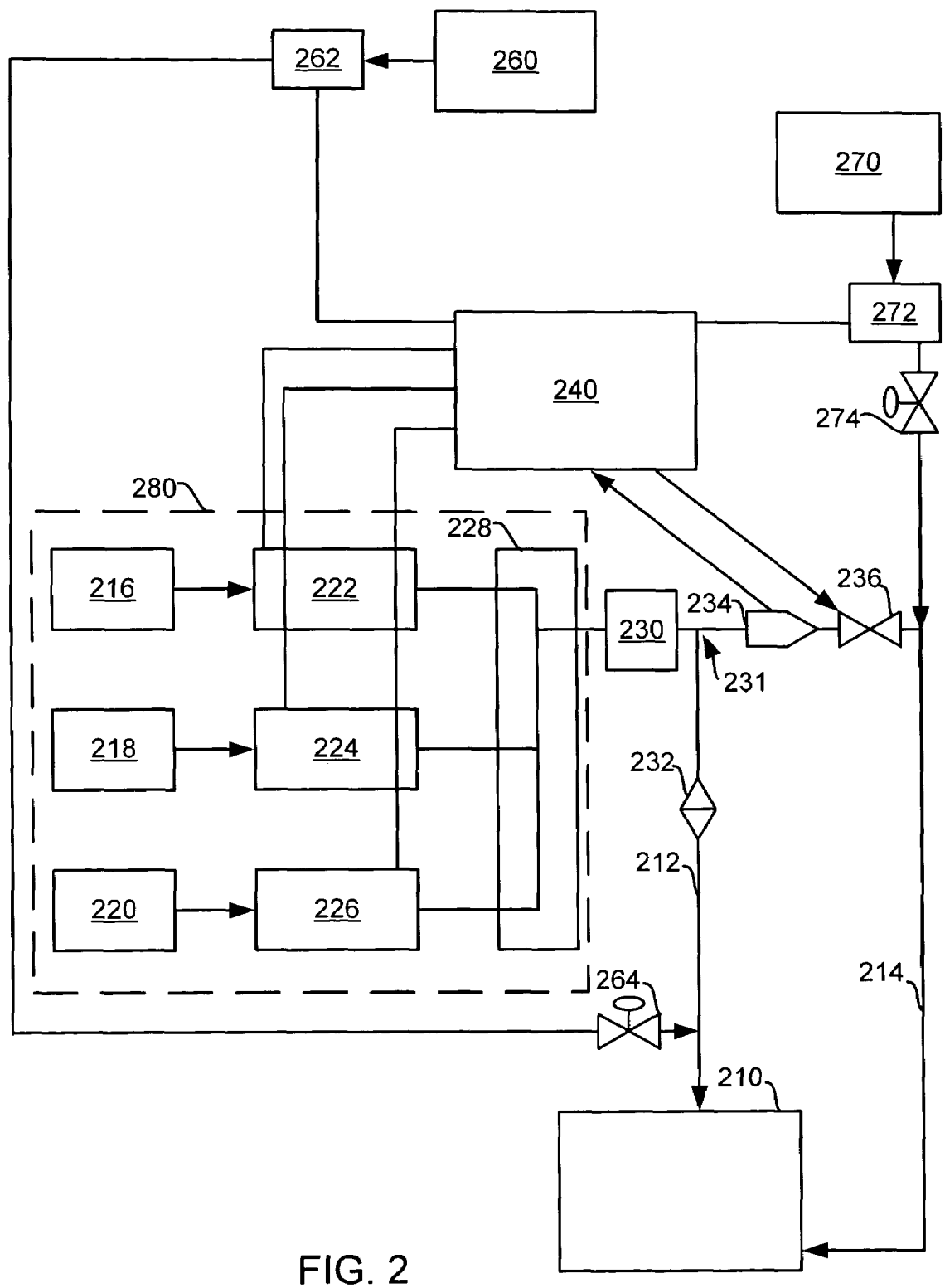
FIG. 2 is a schematic view of a tuning device on a dual gas feed device.

FIG. 2 is a schematic illustration of an embodiment of the invention. A processing chamber 210 is supplied processing gas through gas supply line 212 (which can provide process gas to a showerhead or other gas supply arrangement arranged in the upper portion of the chamber) and a gas supply line 214 (which supplies processing gas to a lower portion of the chamber such as, for example, to a gas distribution ring surrounding the substrate holder or through gas outlets arranged in the substrate support). However, an alternative dual gas feed arrangement can supply gas to the top center and top perimeter of the chamber. The processing chamber 210 may be a plasma etcher. Processing gas is supplied to the gas lines 212, 214 from gas supplies 216, 218, 220, the process gasses from supplies 216, 218, 220 being supplied to mass flow controllers 222, 224, 226, respectively. The mass flow controllers 222, 224, 226 supply the process gasses to a mixing manifold 228 after which the mixed gas passes through an optional flow meter 230, which in turn directs the mixed process gas through a flow divider 231 to two legs, which are the flow lines 212, 214. Flow line 212 can include an optional flow restricting device 232 and flow line 214 can include a flow measurement device 234 and a feedback control valve 236. The gas supplies 216, 218, 220, mass flow controllers 222, 224, 226, and mixing manifold 228 form a gas box 280. Other types of gas supplies may be used instead of a gas box.

A control system 240 monitors the flow measurement device 234 and is effective to control the mass flow controllers 222, 224, 226 as well as the feedback control valve 236. This feedback control system allows adjustment of the proportion of mixed gas delivered to two zones of the processing chamber. The optional flow restricting device 232 can be a fixed orifice or needle valve or the like.

The flow divider 231, flow lines 212, 214, the restricting device 232, flow measurement device 234, and feedback control valve 236 form a flow splitter, which is able to provide set ratios of the flow through the flow lines 212, 214 to different parts of the processing chamber 210. Such a flow splitter provides a plurality of legs, where each leg provides a fraction of the flow from the gas source to a different part of the processing chamber 210.

A first tuning gas mass flow controller 262 is in fluid connection with a first downstream tuning gas supply 260 and is controllably connected to the control system 240. The first tuning gas mass flow controller 262 is in fluid connection with gas supply line 212. An on/off valve 264 may be connected between the first tuning gas mass flow controller 262 and the gas supply line 212. A second downstream tuning gas supply 270 is also provided. A second tuning gas mass flow controller 272 is in fluid connection with the second downstream tuning gas supply 270 and is controllably connected to the control system 240. The second tuning gas mass flow controller 272 is in fluid connection with gas supply line 214. An on/off valve 274 may be connected between the second tuning gas mass flow controller 272 and the gas supply line 214. The tuning gas is preferably the same as a component gas provided by the gas source 280. The tuning gas can be an inert carrier gas, such as argon. The first downstream tuning gas supply 260 and the second downstream tuning gas supply 270 may be considered a tuning gas source. The tuning gas source, the first tuning gas mass flow controller 262, the on/off valve 264, the second tuning gas mass flow controller 272, and the second on/off valve 274 form a tuning gas system that is in fluid connection with and supplies tuning gas to the first and second legs.

In operation, the user would select set points for the flows of each feed gas within the gas box, and would select the fraction of mixed flow to be delivered to each region of the processing chamber. For example, the user might select a flow of 100 sccm $Cl_2$/200 sccm $BCl_3$/4 sccm $O_2$ with 75% delivered through line 212 and 25% through line 214. The fraction of mixed flow in the respective delivery lines is controlled by repeated adjustment of the feedback control valve in line 214 based upon the actual flow measured in line 214 with respect to its target flow. By comparing the total flow, which in this case could be measured by summing all of the flow readouts of the mass flow controllers 222, 224, 226 in the gas box, with the flow measured by the meter in the chamber delivery line 212, the controller can adjust the degree of throttling in the valve 236 in line 214 to achieve the desired flow distribution. In this example, the valve 236 acts as a flow resistance device in the second leg to obtain the desired flow ratio between the first leg and second leg. The control system 240 is able to adjust the resistance and thus the flow through the second leg by adjusting the feedback control valve 236.

Thus, the gas delivered through a first leg, line 212, is identical and three times the rate of gas delivered through the second leg, line 214. In addition to having different flow ratios between the different legs, it is desirable to have other differences in the gases delivered through the legs. For example, it may be desirable to have a higher percentage flow of carrier gas, such as argon in the second leg, line 214, flowing in the bottom of the chamber 210. In such a case, the controller 240 signals to the second tuning gas mass flow controller 272 to provide an increased percentage of flow of the carrier gas.

In another example, if it is desired that a higher concentration of an active etching gas component is desired in the first leg, line 212, controller 240 signals to the first tuning gas mass flow controller 262 to provide an increased amount of the active etching gas component from the first tuning gas source 260. The valves 264, 274 are provided so that, if no gas is to be provided by the first or second tuning gas source 260, 270, the valves 264, 274 may be closed to prevent the mass flow controllers 262, 272 from leaking. The first and second tuning gas sources preferably have the same gases, but may have different gases.

Figure 3:
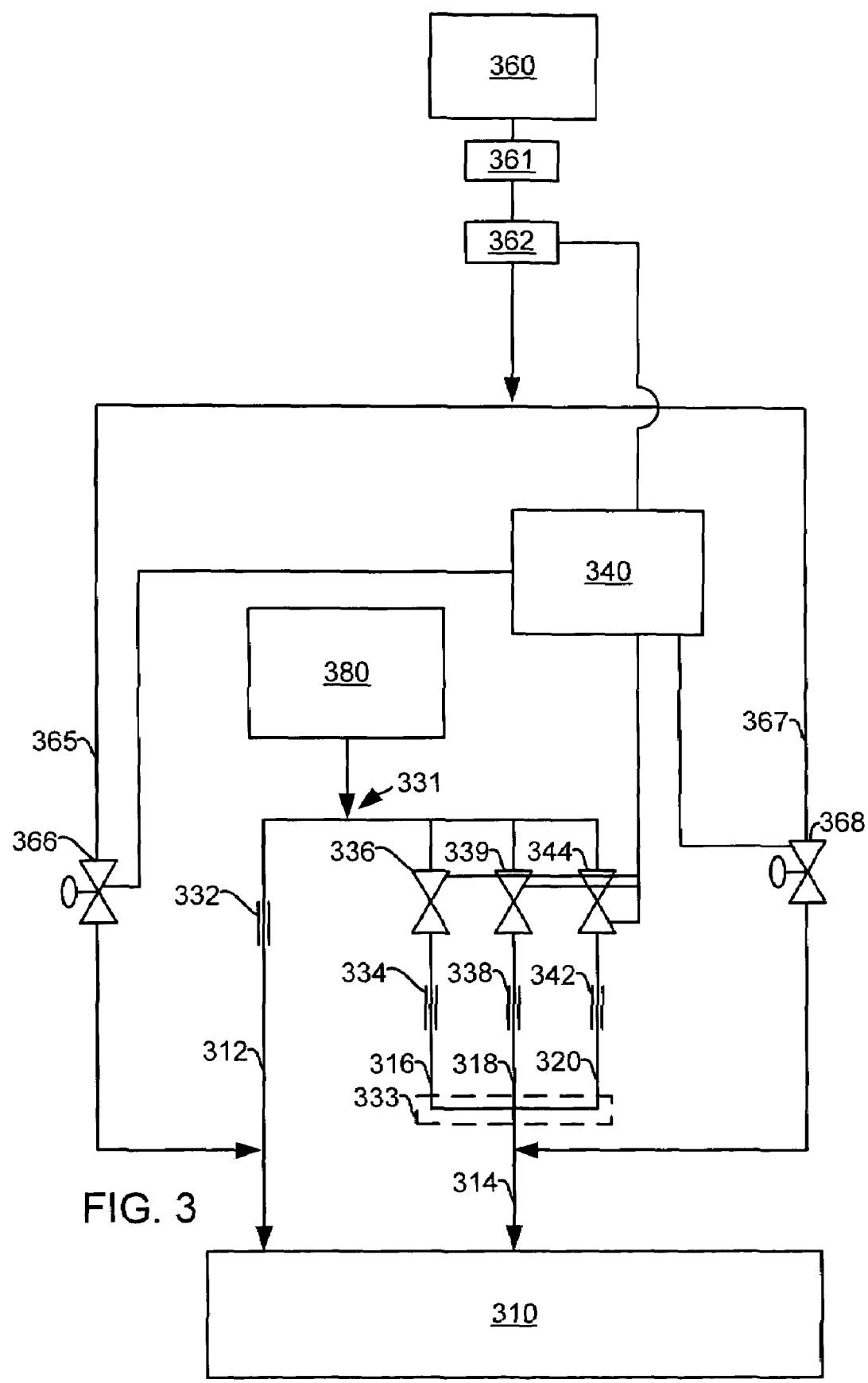
FIG. 3 is a schematic view of another tuning device on another dual gas feed device.

The tuning gas feature of this invention provides a higher degree of control over the etch profiles, etch rates and top and bottom critical dimensions. Wafer profile and CD uniformity is becoming more challenging with the introduction of larger wafers, such as 300 mm, and smaller features sizes, such as $\leq 0.13$ micron. Rather than simply distributing various percentages of the same mixed gas to each wafer region, which is the limit of a splitter, the tuning gas feature can be used solely by itself without any mixed gas in one wafer region to provide a more extreme variation in etch feature profiles and etch rates. Also, the tuning gas feature can provide unique profile and etch rate variations to a specific wafer region by adding a small amount of unique gas that may or may not be part of the mixed gas chemistry. FIG. 3 is a schematic illustration of another embodiment of the invention. A plasma processing chamber 310 is supplied processing gas through gas supply line 312 (which can provide process gas to an outer zone of a showerhead) and a gas supply line 314 (which supplies processing gas to an inner zone of a showerhead). Thus, the different gas supply lines 312, 314 provide gas to different parts of the plasma processing chamber 310. Processing gas is supplied to the gas lines 312, 314 from the gas supply 380 through a flow divider 331. In this embodiment, a fixed orifice 332 or needle valve or the like is placed on the first leg, formed by the gas supply line 312. The first leg in this embodiment is the master leg, where the orifice 332 is relatively wide open, but provides some small resistance on the gas supply line 312.

The second leg, formed by gas supply line 314, is formed by a first parallel flow 316, a second parallel flow 318, and a third parallel flow 320, which are joined together by a manifold 333. Other embodiments may have more or less parallel flows. The first parallel flow 316 has a first fixed orifice 334 and a first flow valve 336. The first fixed orifice 334 provides a resistance so that, when fluid passes only through the gas supply line 312 and the first parallel flow 316, 30% of the flow passes through the first parallel flow and the remaining 70% of the flow passes through the gas supply line 312. The second parallel flow 318 has a second fixed orifice 338 and a second flow valve 339. The second fixed orifice 338 provides a resistance so that, when fluid passes only through the gas supply line 312 and the second parallel flow 318, 20% of the flow passes through the second parallel flow and the remaining 80% of the flow passes through the gas supply line 312. The third parallel flow 320 has a third fixed orifice 342 and a third flow valve 344. The third fixed orifice 342 provides a resistance so that, when fluid passes only through the gas supply line 312 and the third parallel flow 320, 10% of the flow passes through the third parallel flow 320 and the remaining 90% of the flow passes through the gas supply line 312.

A downstream tuning gas supply 360 is also provided. A tuning gas mass flow controller 362 is in fluid connection with the downstream tuning gas supply 360 and is controllably connected to the control system 340. A pressure regulator 361 is placed between the downstream tuning gas supply 360 and the tuning gas mass flow controller 362. The flow of the tuning gas is divided into a first tuning line 365 in fluid connection with gas supply line 312 and a second tuning line 367 in fluid connection with gas supply line 314. A first tuning valve 366 may be provided on the first tuning line 365. A second tuning valve 368 may be provided on the second tuning line 367. The tuning gas is preferably the same as a component gas provided by the gas supply 380. The tuning gas is provided downstream from the first fixed orifice 334, the second fixed orifice 338, and the third fixed orifice 342 on the second leg. The tuning gas is provided downstream from the orifice 332 of the first leg.

The control system 340 is controllably connected to the tuning gas mass flow controller 362, the first flow valve 336, the second flow valve 339, the third flow valve 344, the first tuning valve 366, and the second tuning valve 368.

In operation, the user would select set points for the flows of each feed gas within the gas box, and would select the fraction of mixed flow to be delivered to each region of the processing chamber. For example, the user might select that 70% of the flow be delivered through line 312 and 30% through line 314. In such a case, the first flow valve 336 is opened to allow flow, while the second flow valve 339 and the third flow valve 344 are closed. The gas flows through only gas supply line 312 and the first parallel flow 316 of gas supply line 314. In this example, the first fixed orifice 334 acts as a flow resistance device in the second leg to obtain the desired 70:30 flow ratio between the first leg and second leg. The control system 340 is able to adjust the resistance and thus the flow through the second leg by opening one of the first, second, or third flow valves 336, 339, 344 to provide flow through the first, second, or third fixed orifices, which provide different resistances.

Thus the gas delivered through a first leg, line 312, is identical to the gas delivered through the second leg, line 314 with a flow ratio of 70:30. In addition to having different flow ratios between the different legs, it is desirable to have other differences in the gases delivered through the legs. In this example, it is desired that a higher concentration of an active etching gas component is desired in the second leg, line 314. The controller 340 provides signals to the tuning gas mass flow controller 362 to provide the desired flow rate of the tuning gas. The controller 340 also provides signals to close the first tuning valve 366 and open the second tuning valve 368. This results in tuning gas flowing from the tuning gas source 360, through the tuning gas mass flow control 362 and through the second tuning valve to gas supply line 314.

The controller 340 may be any computer system that has computer readable media with computer code to instruct the controller when to open and close valves.

Figure 4A:
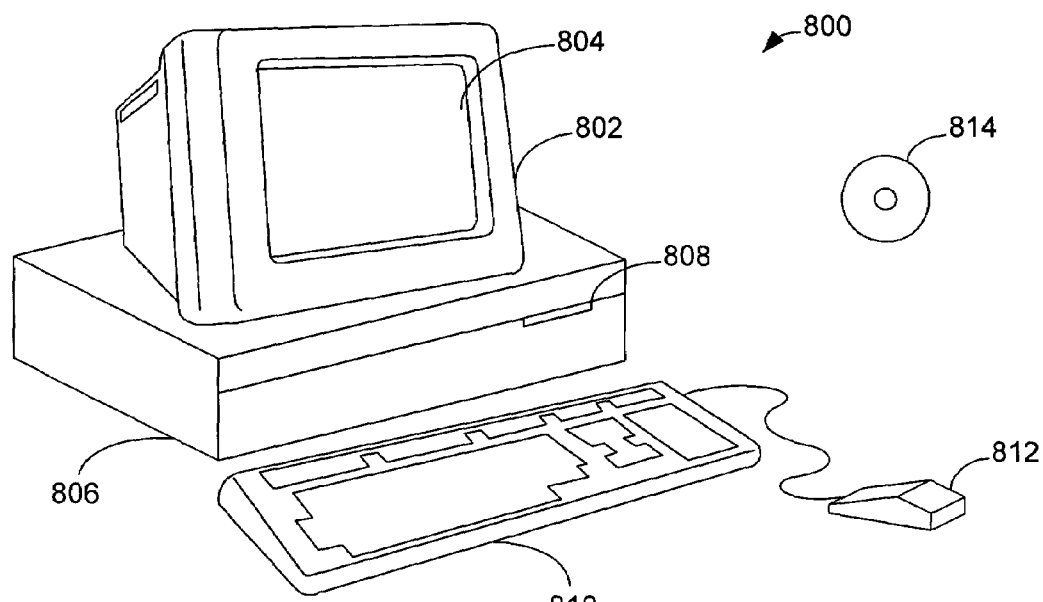
FIGS. 4A-B are schematic illustrations of a computer system that may be used as a controller.
Figure 4B:
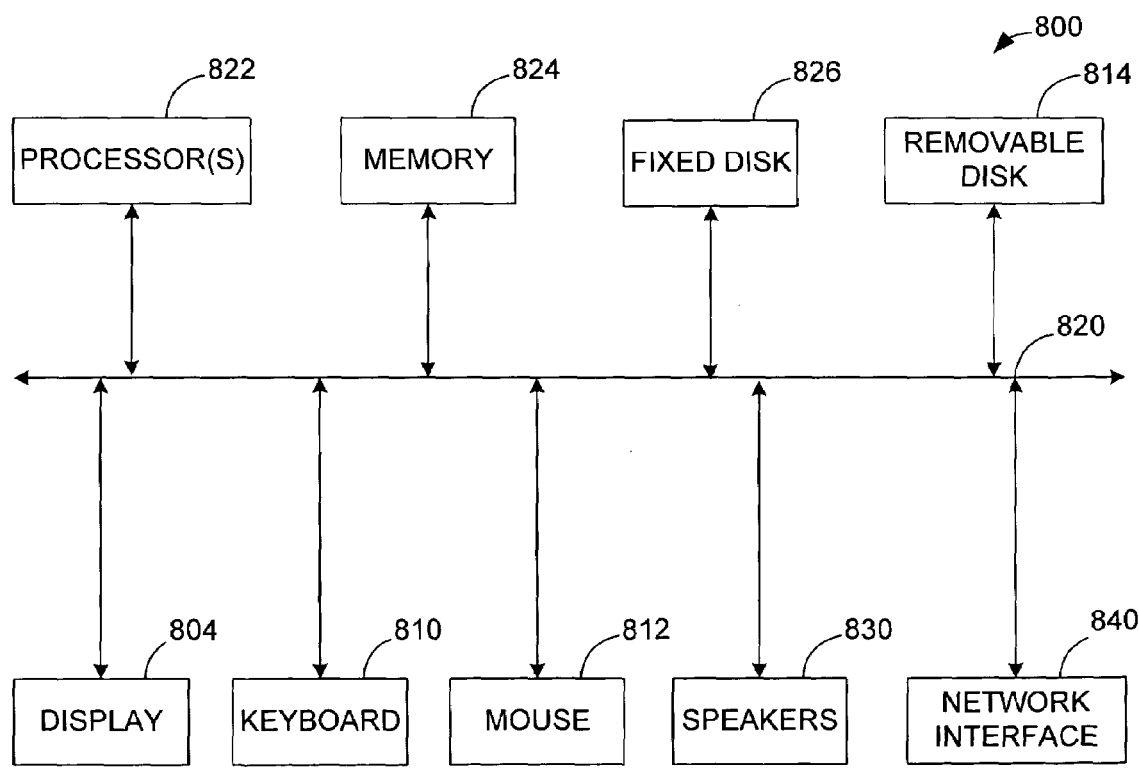

In a preferred embodiment of the invention, the plasma processing chamber uses a confined plasma system, which confines the plasma to a region above the wafer. Such a confined plasma system may use confinement rings, as disclosed in U.S. Pat. No. 6,019,060, by Eric Lenz, entitled "CAM-BASED ARRANGEMENT FOR POSITIONING CONFINEMENT RINGS IN A PLASMA PROCESSING CHAMBER", issued Feb. 1, 2000, which is incorporated by reference for all purposes. Such a plasma confinement system is used in the 2300 Exelan chamber, made by Lam Research Corporation of Fremont, Calif. FIGS. 4A and 4B illustrate a computer system 800, which is suitable for using as the controller 340. FIG. 4A shows one possible physical form of a computer system that may be used for the controller 340. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 is a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

EXAMPLE

Figure 5:
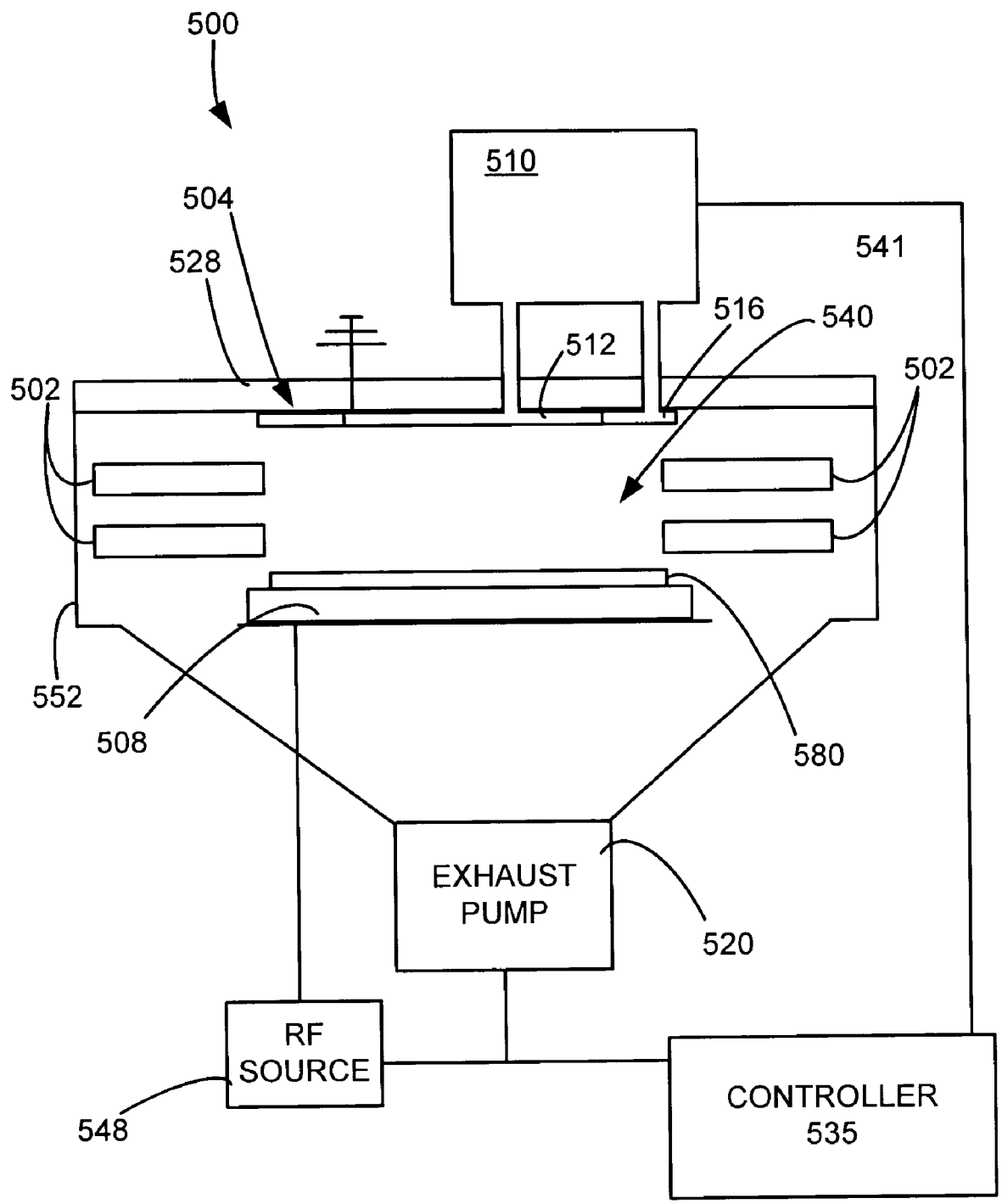
FIG. 5 is a schematic view of such a process chamber that may be used in practicing the invention.

In an example of the implementation of the invention, an 2300 Exelan chamber, made by Lam Research Corporation of Fremont, Calif. is used as the etch process chamber for a 200 mm wafer, using a dual gas distribution system with a tuning gas as described above. FIG. 5 is a schematic view of such a system 500. In this example, the plasma processing chamber 500 comprises confinement rings 502, a gas distribution plate 504, a lower electrode 508, a gas source 510, and an exhaust pump 520. Within plasma processing chamber 500, the substrate wafer 580, on which the oxide layer is deposited, is positioned upon the lower electrode 508. The lower electrode 508 incorporates a suitable substrate chucking mechanism (e.g., electrostatic, mechanical clamping, or the like) for holding the substrate wafer 580. The reactor top 528 incorporates the gas distribution plate 504 disposed immediately opposite the lower electrode 508. The gas distribution plate forms an upper electrode, which is grounded. The gas distribution plate 504, lower electrode 508, and confinement rings 502 define the confined plasma volume 540.

Figure 6:
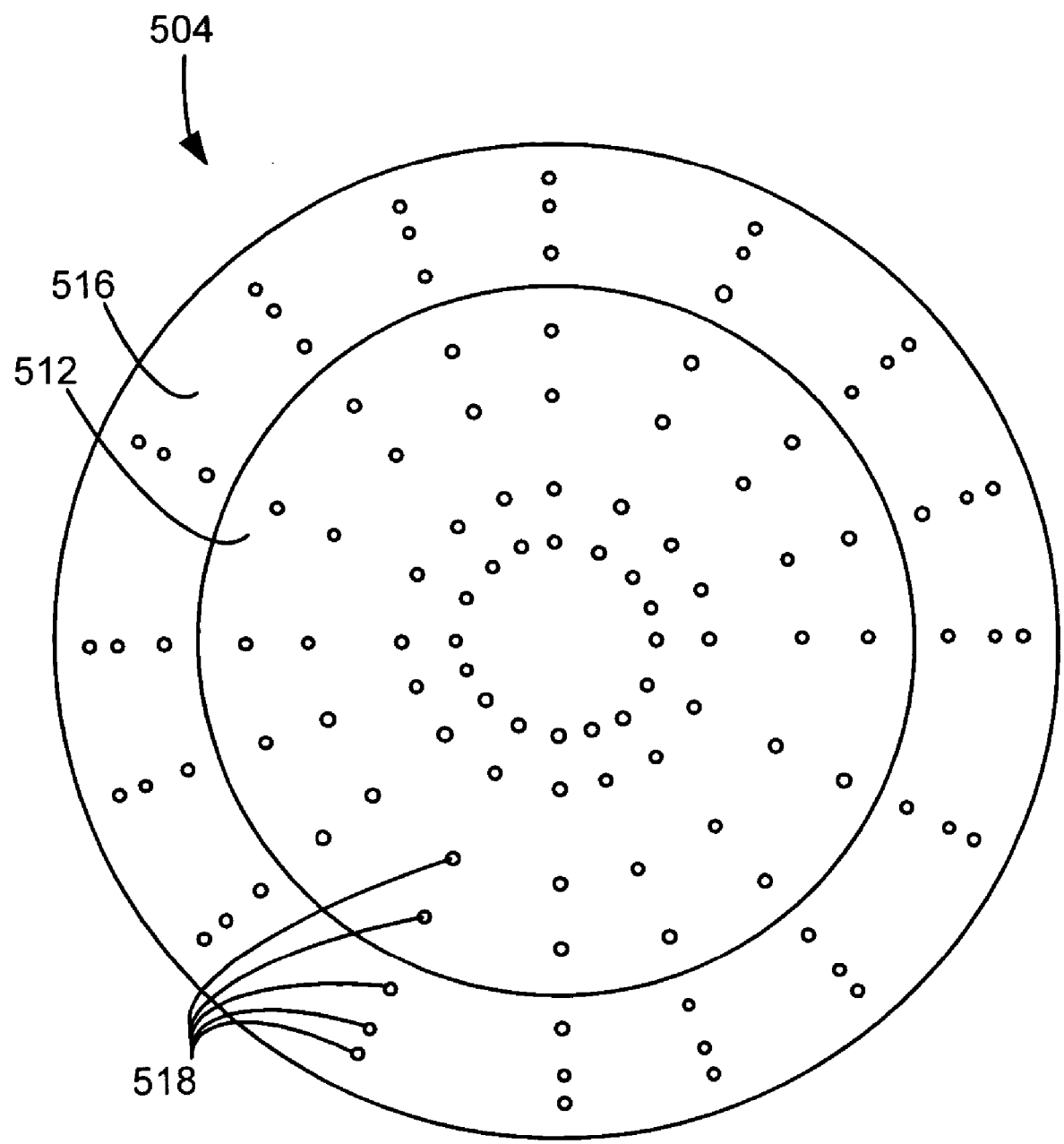
FIG. 6 is a schematic bottom view of a gas distribution plate.

FIG. 6 is a schematic bottom view of the gas distribution plate 504. The gas distribution plate comprises an inner zone plate 512 and an outer zone plate 516. A plurality of ports 518 is formed in the inner zone plate 512 and the outer zone plate 516. The ports 518 may be placed in various configurations, where the shown configuration is provided to mainly to illustrate that each zone plate has a plurality of ports 518. Both the inner zone plate 512 and the outer zone plate 516 are spaced apart from and opposite from the wafer 580 on the lower electrode 508. The gas source 510 may be any gas source that provides different gases to the inner zone plate 516 and the outer zone plate 518. An example of the gas source may be the gas distribution system with a tuning gas shown in FIG. 3.

Gas is supplied to the confined plasma volume by gas source 510 through the ports 518 of the inner zone plate 512 and the outer zone plate 516, and is exhausted from the confined plasma volume through the confinement rings 502 and an exhaust port by the exhaust pump 520. The exhaust pump 520 forms a gas outlet for the plasma processing chamber. A RF source 548 is electrically connected to the lower electrode 508. Chamber walls 552 define a plasma enclosure in which the confinement rings 502, the gas distribution plate 504, and the lower electrode 508 are disposed. The RF source 548 may comprise a high frequency power source operating at 27 MHz and a low frequency power source operating at 2 MHz. The gas distribution plate 504 may be grounded. Different combinations of connecting RF power to the electrodes are possible. A controller 535 is controllably connected to the RF source 548, the exhaust pump 520, and the gas source 510.

Gas mixture of 300 sccm (standard cubic centimeters per minute) Argon, 28 sccm $C_4F_8$, and 9 sccm $O_2$ is provided. A chamber pressure of 50 mTorr is maintained. The 27 MHz power source provides 1875 watts of power. The 2 MHz power source provides 1175 watts of power. A dual zone electrostatic chuck is used with backside He cooling pressures of 20 torr for each zone. The lower electrode is maintained at a temperature of about 10° C. The gas distribution plate 504 forming the upper electrode is maintained at a temperature of about 140° C.

In providing a control group, a wafer was etched where the gas source provided 45% of the above gas mixture to the inner zone plate 512 and 55% of the above gas mixture was provided to the outer zone plate 516. No tuning gas was added. FIGS. 7A-C are photographs of cross-sections of a wafer at various distances from the center of the wafer, after the wafer has been etched using the above control process. FIG. 7A shows the etched layer 704 with a feature 708 formed near the center of the wafer. FIG. 7B shows the etched layer 704 with a feature 712 formed about 50 mm from the center of the wafer. In this example, the feature 708 near the center of the wafer is substantially uniform with the feature 712 formed about 50 mm from the center of the wafer. FIG. 7C shows the etched layer 704 with a feature 716 formed about 98 mm from the center of the wafer. The feature 716 formed about 98 mm from the center of the wafer has encountered etch stop, which has limited the depth of the feature. The taper angle, CD, profile, and etch rate of the feature 716 formed about 98 mm from the center of the wafer is not substantially uniform with the features 708, 712 formed at the center and 50 mm from the center of the wafer, as shown.

In one example of the inventive process, the gas source provides 33% of the above gas mixture to the inner zone plate 512 and 67% of the above gas mixture is provided to the outer zone plate 516. 3 sccm of $O_2$ is added as a tuning gas to the flow to the outer zone plate 516. FIGS. 8A-C are photographs of cross-sections of a wafer at various distances from the center of the wafer, after the wafer has been etched using the above inventive process. FIG. 8A shows the etched layer 804 with a feature 808 formed near the center of the wafer. FIG. 8B shows the etched layer 804 with a feature 812 formed about 50 mm from the center of the wafer. In this example, the feature 808 near the center of the wafer is substantially uniform with the feature 812 formed about 50 mm from the center of the wafer. FIG. 8C shows the etched layer 804 with a feature 816 formed about 98 mm from the center of the wafer. The feature 816 formed about 98 mm from the center of the wafer using the inventive process has not encountered etch stop. The taper angle, CD, profile, and etch depth of the feature 816 formed about 98 mm from the center of the wafer is substantially uniform with the features 808, 812 formed at the center and 50 mm from the center of the wafer, as shown.

Figure 9:
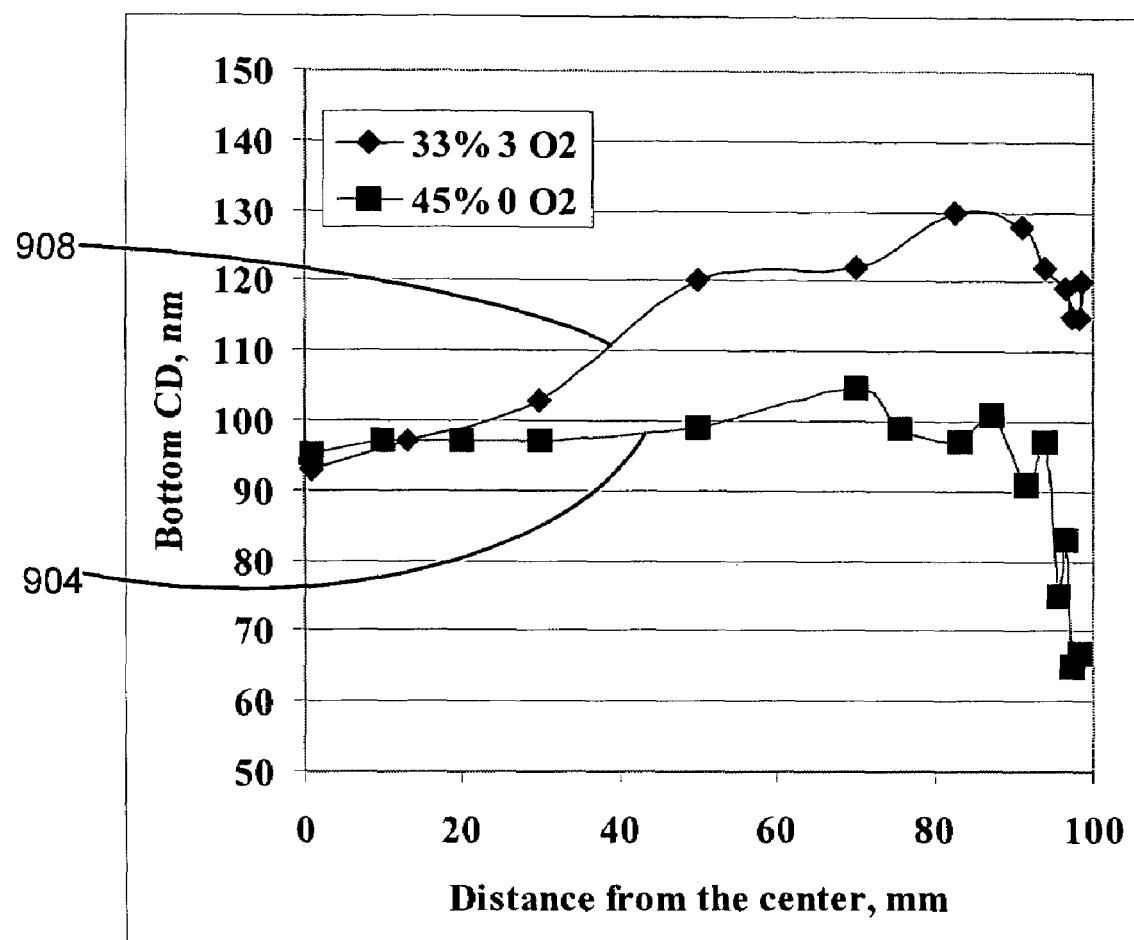
FIG. 9 is a graph of the CD of the features measured at the bottom of the features versus the distance that the feature is from the center of the wafer.

FIG. 9 is a graph of the CD of the features measured at the bottom of the features versus the distance that the feature is from the center of the wafer. A graph 904 for a wafer etched using the control process described above, shows that the CD significantly drops near the edge of the wafer. A graph 908 for a wafer etched using the inventive process described above, shows that there is no drop in CD near the edge of the wafer. Although this graph measures the CD at the bottom of the feature, it has been found that the invention also provides a more uniform CD, when the CD is measured at the top of the feature. Therefore, this example provides a preferred embodiment that provides a more uniform CD for both the top and bottoms of the features.

Figure 10A:
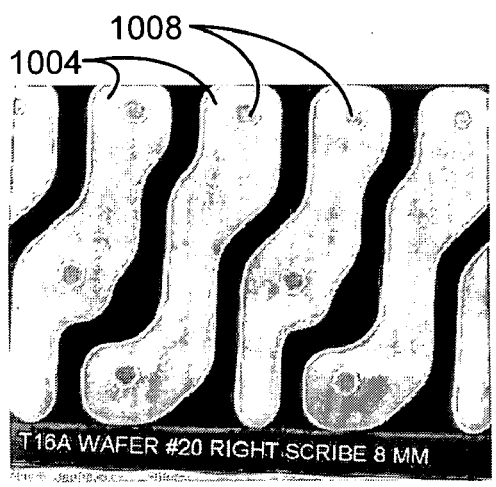
FIGS. 10A-C show top views of connection pads to which the contacts are etched using a control process.
Figure 10B:
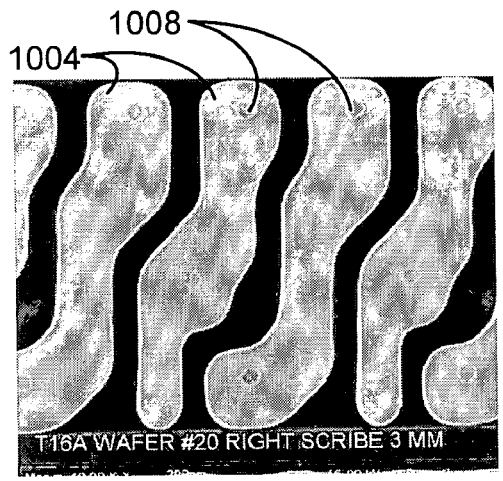
Figure 10C:
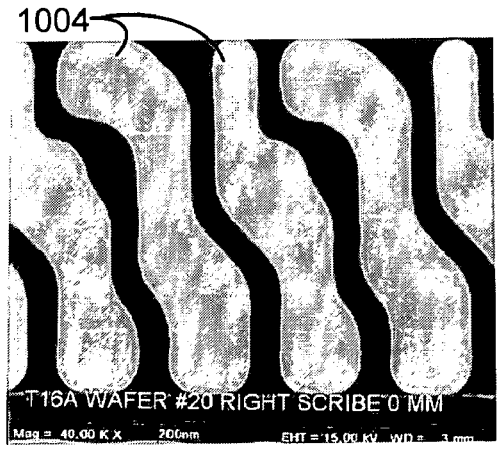

FIGS. 10A-C show top views of connection pads 1004 to which the contacts are etched using the above described control process. FIG. 10A is the top view of connection pads 1004 that are about 92 mm from the center of the wafer. A plurality of dimples 1008 is created in the connection pads 1004, when a feature is etched to the connection pads 1004.

FIG. 10B is a top view of the connection pads 1004 that are about 97 mm from the center of the wafer. A plurality of dimples 1008 is etched in the connection pads 1004. It should be noted that the dimples 1008 in the connection pads 1004 at about 97 mm from the center of the wafer are smaller than the dimples in the connection pads 1004 about 92 mm from the center of the wafer.

FIG. 10C is a top view of the connection pads 1004 that are about 100 mm from the center of the wafer. It should be noted that no dimples are seen in the connection pads 1004. This indicates that at about 100 mm from the center of the wafer the features may not have been etched completely through the etch layer to make dimples in the connection pads 1004.

Figure 1:
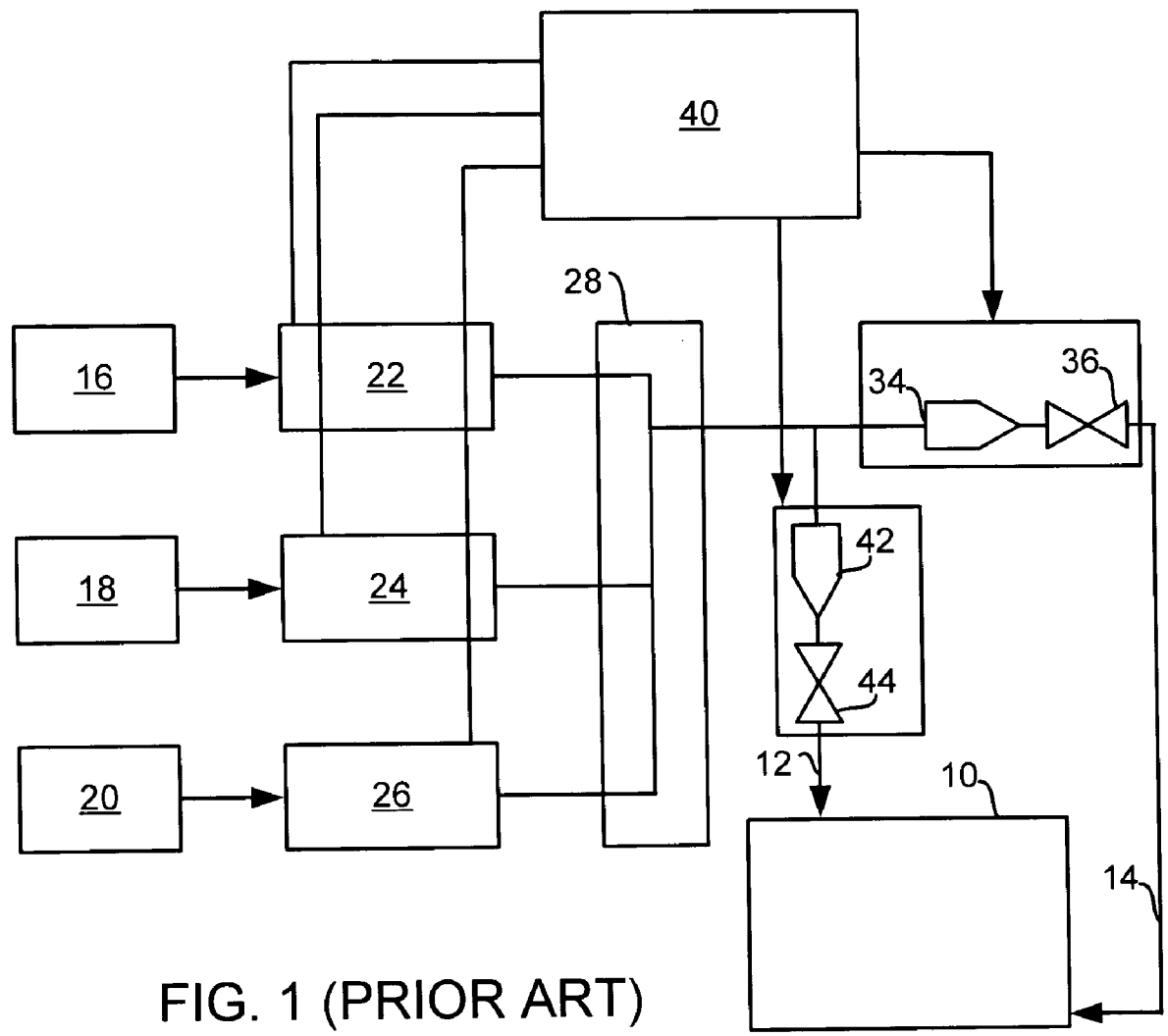
FIG. 1 is a schematic view of a dual gas feed device used in the prior art.
Figure 11A:
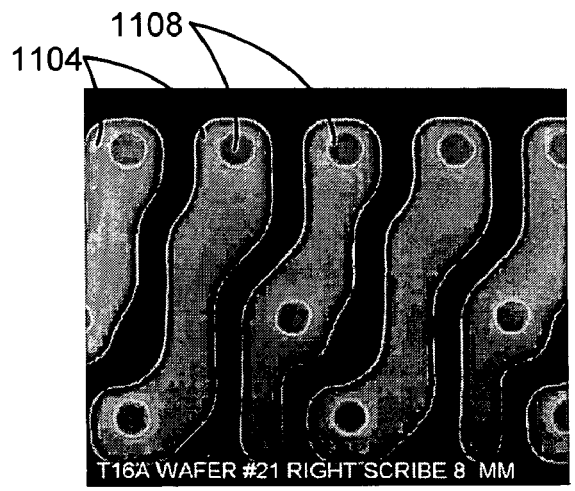
FIGS. 11A-C show top views of connection pads to which the contacts are etched using an inventive process.
Figure 11B:
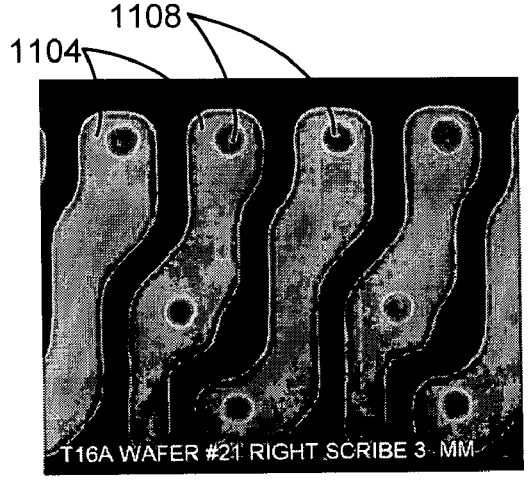
Figure 11C:
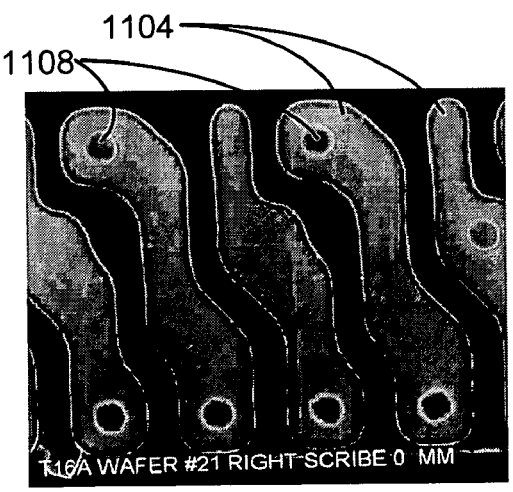

FIGS. 11A-C show top views of connection pads 1104 to which the contacts are etched using the above described inventive process. FIG. 1A is the top view of connection pads 1104 that are about 92 mm from the center of the wafer. A plurality of dimples 1108 is created in the connection pads 1104, when a feature is etched to the connection pads 1104.

FIG. 11B is a top view of the connection pads 1104 that are about 97 mm from the center of the wafer. A plurality of dimples 1108 is etched in the connection pads 1104. It should be noted that the dimples 1108 in the connection pads 1104 at about 97 mm from the center of the wafer are substantially the same as the dimples in the connection pads 1104 about 92 mm from the center of the wafer.

FIG. 11C is a top view of the connection pads 1104 that are about 100 mm from the center of the wafer. A plurality of dimples 1108 is etched in the connection pads 1104. It should be noted that the dimples 1108 in the connection pads 1104 at about 100 mm from the center of the wafer are substantially the same as the dimples 1108 in the connection pads 1104 about 92 mm and 97 mm from the center of the wafer.

A comparison of the results above helps to show the improvement in etch profiles and top and bottom CD variation with and without the invention. In this example, small amount of $O_2$ was added to the outside region of the wafer using the tuning gas feature. By adjusting the flow rate percentage through the different legs, as well as, adding the tuning gas, changes in profile, top CD, bottom CD, underlayer selectivity and etch rate can be effected. This helps to control the etching characteristics, center to edge, on 200 mm substrates and more so on larger 300 mm substrates and hence affect device performance.

Without wishing to be bound by theory, neutral gas concentration models may be used to explain the different gas chemistries seen at the center and edge of the wafer substrate. Due to the radial pumping of gases, the gas concentrations fall at the edge of the substrate. If the gas concentration falls uniformly then the gas mixture can be adjusted over the substrate to adjust for this effect. Different molecular weight of gases can affect their pumping and hence their concentration center to edge varies over the wafer substrate. The larger neutral molecules will have a higher concentration at the edge of the wafer in comparison to the lighter neutral molecules. In one example, the tuning gas feature of the invention may be used to introduce a greater flow of the lighter gases to the outside region of the wafer substrate and to correct for the drop in concentration due to our radial pumping. For example, in the above example, $O_2$ is the lighter neutral molecule; this is why extra $O_2$ is added as a tuning gas to the outer zone plate.

Therefore, the tuning gas feature provides many more profile tuning options than the prior art. The tuning options provided are the tuning of the center to edge gas ratios and additional additives at tunable flow rates to either the center or edge. By providing more tuning options the invention may be tuned to provide a higher degree of CD uniformity, profile uniformity, taper angle uniformity, an increased selectivity, and an increased etch rate uniformity. CD uniformity is provided when the critical dimensions (CD) of features at the center of a wafer is the same as the CD of features closer to the edge of the wafer. Profile uniformity is when the profile of a feature near the center of a wafer is the same as a profile of a feature further away from the center. Taper angle uniformity provides that the taper angle of a feature near the center of a wafer is the same as the taper angle for a feature closer to the edge of the wafer. Increased selectivity provides that the etch selectivity between two different materials be uniform from the center of the wafer to the edge of the wafer. A uniform etch rate provides that the etch rate be uniform from the center of the wafer to the edge of the wafer.

Figure 12A:
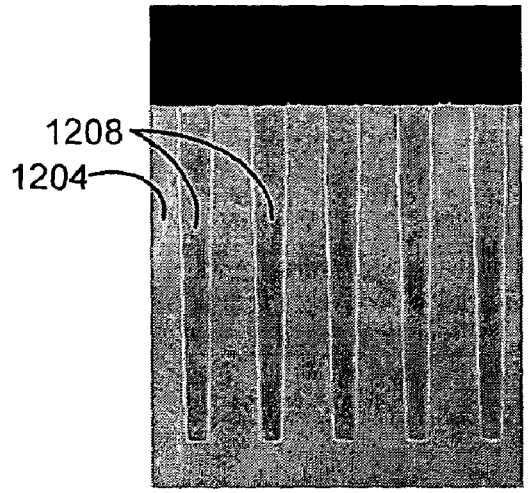
FIGS. 12A-B are show cross-sections of a 300 mm wafer that has been etched using a control process.
Figure 12B:
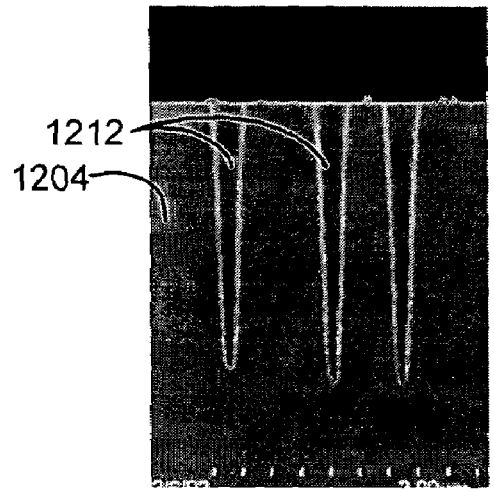

The invention may provide even more uniformity during the etching of a larger 300 mm wafer. In a second example of the implementation of the invention, an 2300 Exelan chamber, made by Lam Research Corporation of Fremont, Calif. is used as the etch process chamber for a 300 mm wafer, using a dual gas distribution system with a tuning gas as described above. A gas mixture of 250 sccm (standard cubic centimeters per minute) Argon, 30 sccm $C_4F_8$, 15 sccm $C_4F_6$ and 22 sccm $O_2$ is provided. A chamber pressure of 30 mTorr is maintained. The 27 MHz power source provides 2800 watts of power. The 2 MHz power source provides 3200 watts of power. The lower electrode is maintained at a temperature of about 40° C. The gas distribution plate 504 forming the upper electrode is maintained at a temperature of about 140° C. In providing a control group for this second example, a wafer was etched where the gas source provided 65% of the above gas mixture to the inner zone plate 512 and 35% of the above gas mixture was provided to the outer zone plate 516. No tuning gas was added. FIGS. 12A-B show cross-sections of a 300 mm wafer that has been etched using the control process described above. FIG. 12A is a cross-sectional view of the layer to be etched 1204 near the center of the wafer. A plurality of features 1208 is etched near the center. FIG. 12B is a cross-sectional view of the layer to be etched 1204 about 130 mm away from the center of the wafer. A plurality of features 1212 is etched at about 130 mm away from the center of the wafer. It should be noted that the features 1208 near the center of the wafer have different etch lengths, profiles, taper angles, and CD's than the features 1212 at about 130 mm from the center.

Figure 13A:
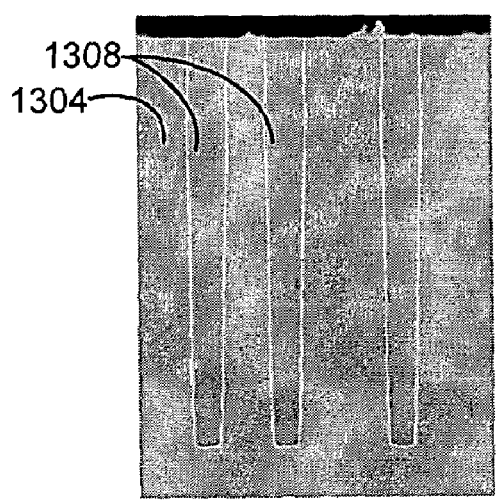
FIGS. 13A-B show cross-sections of a 300 mm wafer that has been etched using an inventive process.
Figure 13B:
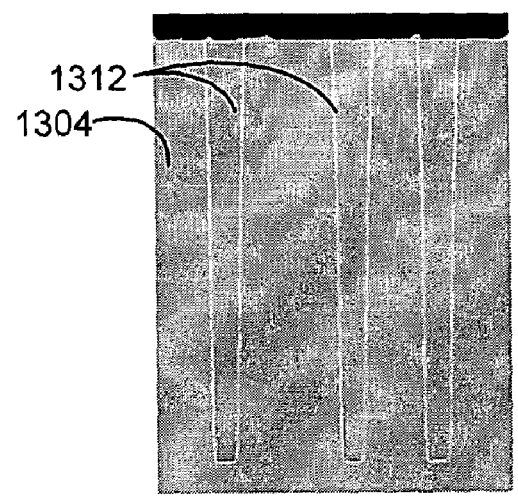

FIGS. 13A-B show cross-sections of a 300 mm wafer that has been etched using the inventive process described above with the addition of 4 sccm of $O_2$ as a tuning gas to the flow to the outer zone plate 516. FIG. 13A is a cross-sectional view of the layer to be etched 1304 near the center of the wafer. A plurality of features 1308 is etched near the center. FIG. 13B is a cross-sectional view of the layer to be etched 1304 about 130 mm away from the center of the wafer. A plurality of features 1312 is etched at about 130 mm away from the center of the wafer. It should be noted that the features 1308 near the center of the wafer have substantially the same etch depths, profiles, taper angles, and CD's than the features 1312 at about 130 mm from the center.

Process

Figure 14:
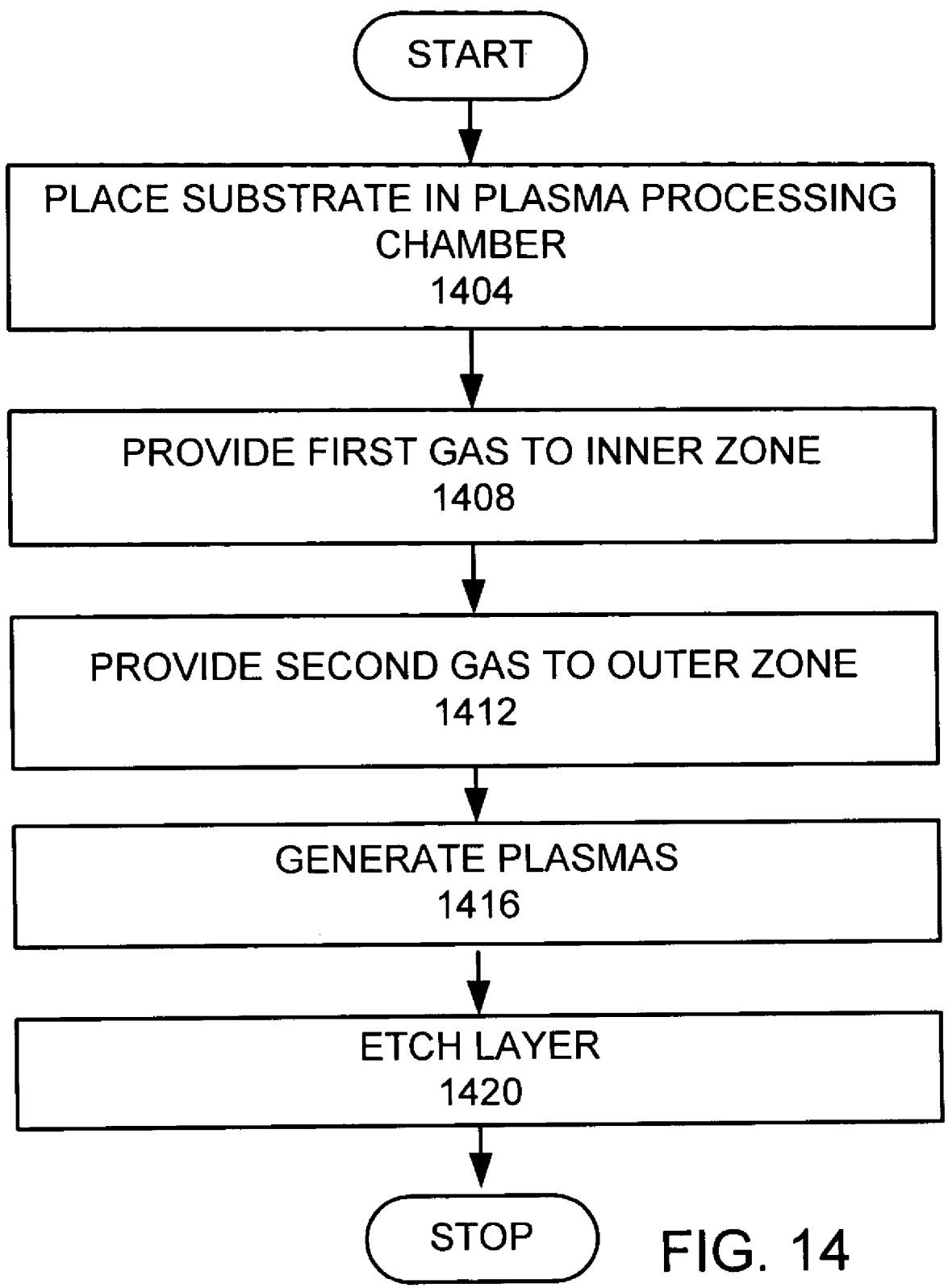
FIG. 14 is another flow chart of the inventive process.

FIG. 14 is a flow chart of the inventive process described in the above example, which may use various apparatus to accomplish the invention. A wafer forming a substrate is placed in a plasma processing chamber (step 1404). A plasma process chamber 500 described above is one example of such a process chamber, however other process chambers may be used. A first gas is provided to the inner zone 512 of the gas distribution system (step 1408). A second gas is provided to the outer zone 518 of the gas distribution system (step 1412). The first gas is different than the second gas. Plasmas are simultaneously generated from the first and second gas, by forming a plasma from the first gas and a plasma from the second gas (step 1416). A layer is etched by the plasmas from the first gas and second gas (step 1420). Although the providing the first gas (step 1408) and the providing the second step (step 1412) are shown sequentially, these steps may be done in opposite order or may be done simultaneously.

In the specification and claims, a first gas is defined as a gas with a single component or with a plurality of components to form a gas mixture. A first gas is different than a second gas, only if the first gas and second gas have different components or the same components in different ratios. Different flow rates of gases with the same components at the same ratios are not different gases. In the above example, the ratio of the gases, $O_2$ to (the fluorocarbon gases) $C_4F_6$ and $C_4F_8$, for the inner zone is 22:45. For the outer zone an additional 4 sccm of $O_2$ was added to the 35% flow of 22 sccm $O_2$, 15 sccm of $C_4F_6$ and 30 sccm of $C_4F_8$. Therefore the flow of $O_2$ to the outer zone is (22 sccm)(35%)+4 sccm=10.7 sccm. The flow of $C_4F_8$ and $C_4F_6$ to the outer zone is (45 sccm)(35%)=15.8 sccm, so that the ratio of the gases, $O_2$ to $C_4F_6$ and $C_4F_8$, for the outer zone is 10.7:15.8. Therefore, the ratio of the lower molecular weight component gas to the higher molecular weight component gases is higher for the second gas (outer zone) than the first gas (inner zone). In addition, gases are defined as having different components when one gas has a component that is not in the other gas. Plasmas are generated from the first gas and second gas in that plasma is generated from the first gas and plasma is generated from the second gas. The layer is etched by the plasmas from the first gas and second gas in that plasma generated from the first gas etches the layer and plasma generated from the second gas etches the layer.

Figure 15:
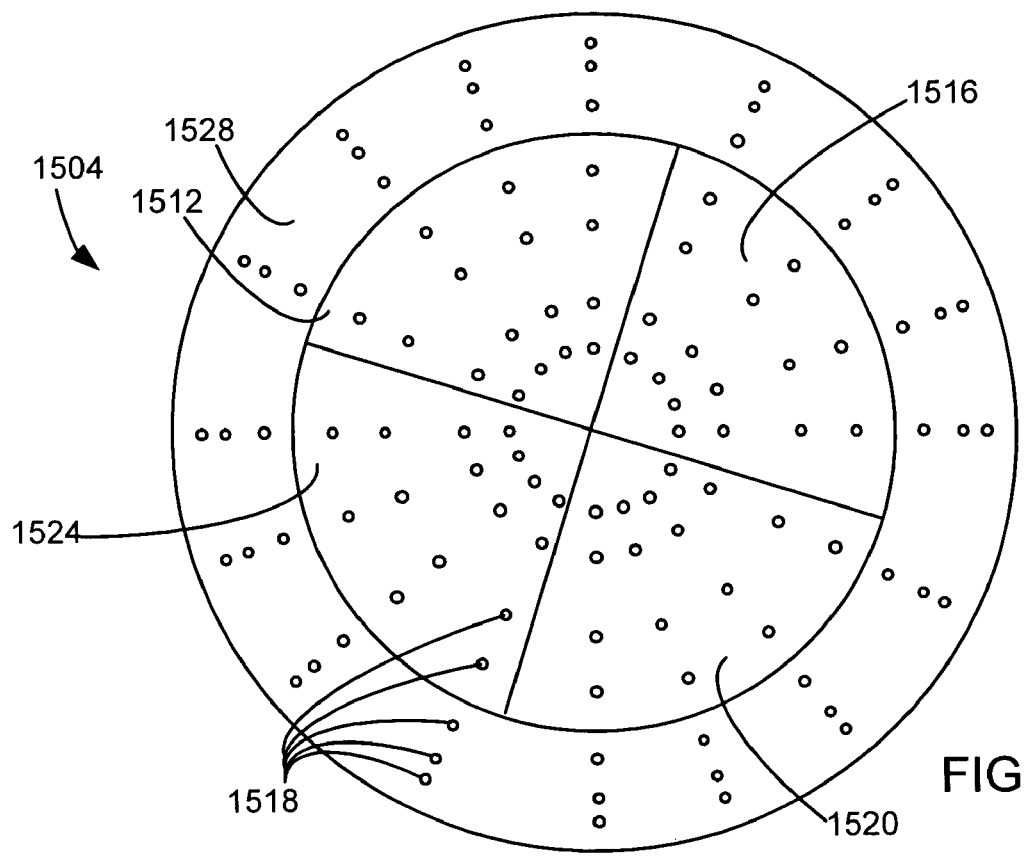
FIG. 15 is a schematic bottom view of another embodiment of a gas distribution plate.

FIG. 15 is a schematic bottom view of another embodiment of a gas distribution plate 1504. The gas distribution plate comprise a first inner zone plate 1512, a second inner zone plate 1516, a third inner zone plate 1520, a fourth inner zone plate 1524, and an outer zone plate 1528. A plurality of ports 1518 are formed in the inner zone plates 1512, 1516, 1520, 1524 and the outer zone plate 1528. The ports 1518 may be placed in various configurations, where the shown configuration is provided to mainly to illustrate that each zone plate has a plurality of ports 1518. Each of the inner zone plates 1512, 1516, 1520, 1524 may provide different gases. To provide a second gas in an outer zone surrounding the inner zone, the outer zone plate 1528 provides a gas that is different than the sum of the gases provided by the inner zone plates 1512, 1516, 1520, 1524.

Figure 16:
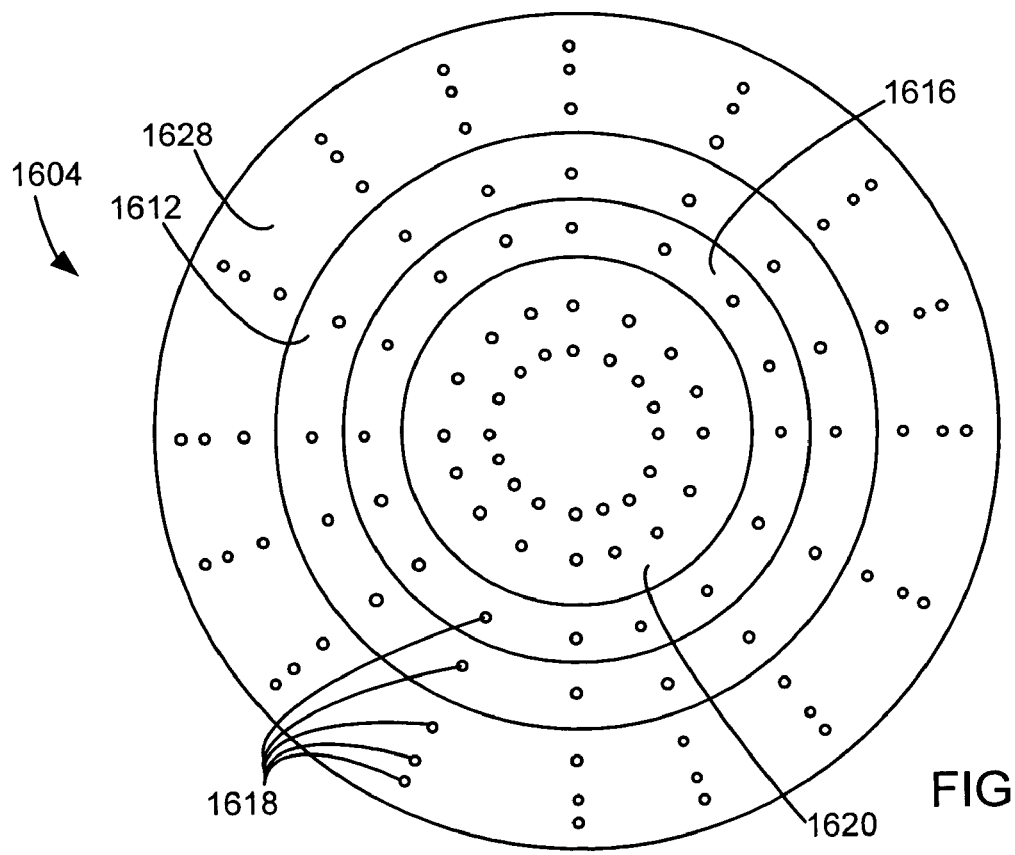
FIG. 16 is a schematic bottom view of another embodiment of a gas distribution plate.

FIG. 16 is a schematic bottom view of another embodiment of a gas distribution plate 1604. The gas distribution plate comprise a first inner zone plate 1612, a second inner zone plate 1616, a third inner zone plate 1620, and an outer zone plate 1628. A plurality of ports 1618 is formed in the inner zone plates 1612, 1616, 1620 and the outer zone plate 1628. The ports 1618 may be placed in various configurations, where the shown configuration is provided to mainly to illustrate that each zone plate has a plurality of ports 1618. Each of the inner zone plates 1612, 1616, 1620 may provide different gases. To provide a second gas in an outer zone surrounding the inner zone, the outer zone plate 1628 provides a gas that is different than one of the gases provided by the inner zone plates 1612, 1616, 1620.

Figure 17:
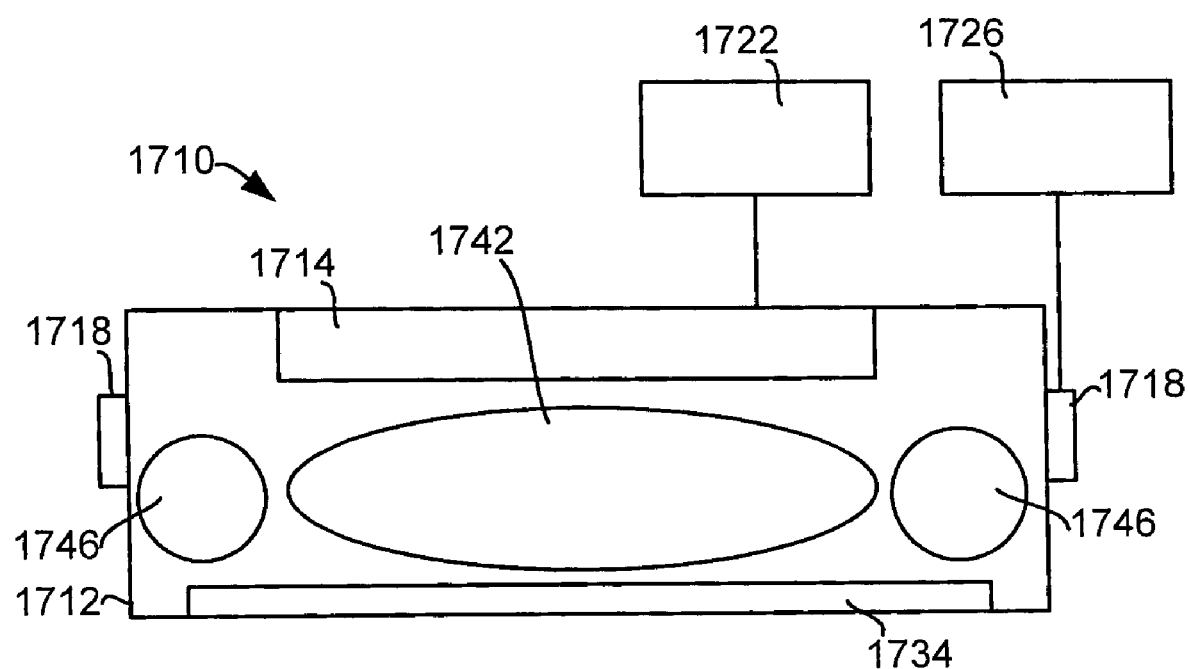
FIG. 17 is a schematic illustration of another device that may be used to provide the invention

FIG. 17 is a schematic illustration of another device that may be used to provide the invention. A plasma processing chamber 1710 comprises a chamber 1712 with an inner gas distribution system 1714 and an outer gas distribution system 1718. The outer gas distribution system 1718 surrounds the chamber 1712 and the inner gas distribution system 1714. A first gas source 1722 is in fluid connection with the inner gas distribution system 1714. A second gas source 1726 is in fluid connection with the outer gas distribution system 1718. A wafer 1734 is mountable in the chamber 1712 opposite the inner gas distribution system 1714. In this device, the first gas source 1722 and the second gas source 1726 are independent systems. The first gas source 1722 provides a first gas through the inner gas distribution system 1714 to an inner gas zone 1742. The second gas source 1726 provides a second gas different than the first gas to an outer gas zone 1746, which surrounds the inner gas zone 1742. As shown, the outer zone 1746 is adjacent to the wafer's edge, while the inner zone 1742 is adjacent to the interior of the wafer 1734 surrounded by the wafer's edge.

Other gas distribution embodiments may be used in other embodiments to provide a first gas to an inner zone and a second gas to an outer zone surrounding the inner zone where the first gas is different than the second gas. For example alternating ports in the outer zone area may provide different component gases, which together make up the second gas provided to the outer zone and/or alternating ports in the inner zone area may provide different component gases, which together make up the first gas, so that the first gas is different than the second gas. However, it is preferable that the component gases of the first gas be combined in the gas distribution system before the first gas is provided into the chamber and that the component gases of the second gas be combined in the gas distribution system before the second gas is provided into the chamber.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching a layer over a substrate, comprising:

placing the substrate in a plasma processing chamber, with a gas distribution system with an inner zone placed opposite an inner portion of the substrate and an outer zone surrounding the inner zone;

combining a first component gas with a second component gas;

splitting the combined first component gas and second component gas into a first gas and a second gas by passing the combined first component gas and second component gas through a first fixed orifice in a first leg connected to the inner zone and a second fixed orifice in a second leg connected to the outer zone;

adding additional first component gas to the second leg, wherein the first component gas has a lower molecular weight than the second gas component, wherein a ratio of the first component gas to the second component gas for the second gas is greater than a ratio of the first component gas to the second component gas for the first gas wherein the second component gas is provided to the first leg connected to the inner zone at a first flow rate greater than or equal to zero from a single tuning gas source, and wherein the adding includes operating a valve connecting the single tuning gas source and the first and second legs such that the first component gas is provided to the second leg connected to the outer zone at a second flow rate greater than or equal to zero from the single tuning gas source, and wherein the second flow rate is different than the first flow rate;

providing the first gas to the inner zone of the gas distribution system;

providing the second gas to the outer zone of the gas distribution system;

simultaneously generating plasmas from the first gas and second gas; and etching the layer, wherein the layer is etched by the plasmas from the first gas and second gas.

2. The method, as recited in claim 1, wherein the first gas is different than the second gas in that the first gas has a first ratio of gases and the second gas has a second ratio of gases, wherein the first ratio is different than the second ratio.

3. The method, as recited in claim 1, wherein the outer zone is adjacent to an edge of the substrate and the inner zone is adjacent to an interior of the substrate surrounded by the edge of the substrate adjacent to the outer zone.

4. The method, as recited in claim 1, further comprising tuning the second gas to the first gas to provide a more uniform etch.

5. The method, as recited in claim 1, further comprising tuning the second gas to the first gas to provide a more uniform critical dimensions, a more uniform taper, a more uniform selectivity, and a more uniform profile.

6. The method, as recited in claim 1, further comprising tuning the second gas to the first gas to provide a more uniform etch.

7. The method, as recited in claim 1, wherein the tuning gas is provided to only one of the first leg and the second leg.

8. The method, as recited in claim 1, wherein the first leg includes a flow resistance device that alters the flow ratio between the first leg and the second leg.

9. The method, as recited in claim 8, wherein the first leg further includes a fixed plate orifice, which provides a specific resistance to gas flow.

10. The method, as recited in claim 8, wherein the first gas is different than the second gas, in that the first gas and the second gas are made of different component gases.

11. The method, as recited in claim 10, further comprising tuning the second gas to the first gas to provide a more uniform etch.

* * * * *